(12) United States Patent  (10) Patent No.: US 7,554,856 B2
Curatolo et al.  (45) Date of Patent: Jun. 30, 2009

(54) MEMORY CELL

(75) Inventors: Giacomo Curatolo, Dresden (DE); Rico Srowik, Dresden (DE)

(73) Assignee: Qimonda Flash GmbH & Co. KG, Dresden (DE)

( * ) Notice: Subject to any disclaimer, the term of this patent is extended or adjusted under 35 U.S.C. 154(b) by 147 days.

(21) Appl. No.: 11/544,287

(22) Filed: Oct. 6, 2006

(65) Prior Publication Data

US 2008/0084757 A1   Apr. 10, 2008

(51) Int. Cl.
*G11C 7/10* (2006.01)
(52) U.S. Cl. .......................... 365/189.011; 365/189.15
(58) Field of Classification Search .......... 365/189.011, 365/189.15
See application file for complete search history.

(56) References Cited

U.S. PATENT DOCUMENTS 6,240,032 B1 *  5/2001  Fukumoto ................... 365/222
7,193,898 B2 *  3/2007  Cernea ................... 365/185.22
2005/0232024 A1  10/2005  Atir et al.

FOREIGN PATENT DOCUMENTS

DE    10 2005 017 828 A1    12/2005

* cited by examiner

*Primary Examiner*—Son Dinh
*Assistant Examiner*—Nam Nguyen
(74) *Attorney, Agent, or Firm*—Slater & Matsil, L.L.P.

(57) ABSTRACT

A method of reading memory includes sensing a plurality of memory cells simultaneously and providing a data signal corresponding to one of a plurality of programming states. The plurality of programming states include a number of programming states equal to twice a number of memory cells in the plurality of memory cells. The data signal is processed, providing binary data representative of the data signal. The binary data includes a number of information bits equal to the number of memory cells.

16 Claims, 3 Drawing Sheets

US 7,554,856 B2

MEMORY CELL

TECHNICAL FIELD

Embodiments of the present invention relate generally to a memory cell.

BACKGROUND

Reading the state of a memory cell of a non-volatile memory (NVM) or flash memory array may be subject to the so-called "neighbor effect." When sensing the state of the memory cell (either source- or drain-side sensing), the current may be drained by a neighboring memory cell, which may significantly alter the sensed current.

BRIEF DESCRIPTION OF THE DRAWINGS

Features and advantages of the invention may be readily appreciated by persons skilled in the art from the following detailed description of exemplary embodiments thereof, as illustrated in the accompanying drawings, in which.

DETAILED DESCRIPTION OF ILLUSTRATIVE EMBODIMENTS

Figure 1:
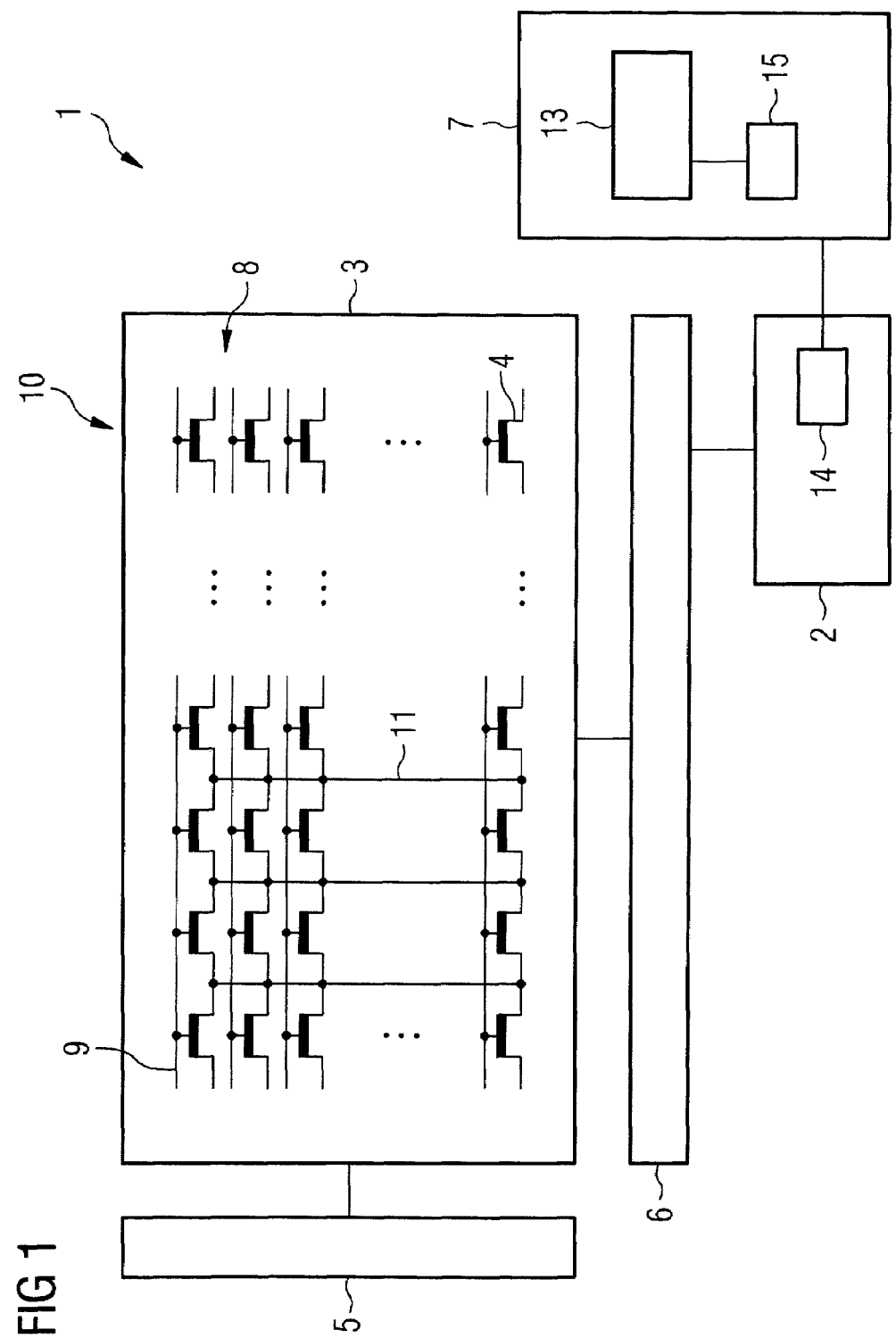
FIG. 1 illustrates a simplified block diagram of an exemplary embodiment of a memory circuit.

In the following detailed description and in the several figures of the drawings, like elements are identified with like reference numerals.

FIG. 1 illustrates a simplified block diagram of an exemplary embodiment of a memory circuit 1. In an exemplary embodiment, the circuit 1 may include a sense amplifier 2, an array 3 of memory cells 4, row and column decoders 5 and 6 and a processor 7. The array 3 of memory cells 4 may include rows 8 of memory cells 4 tied to common wordlines 9 and columns 10 of memory cells 4 tied to common bitlines 11. The row and column decoders 5, 6 may be arranged to selectively energize particular wordlines 9 and bitlines 11 for programming and/or sensing the memory cells 4.

In an exemplary embodiment, the sense amplifier 2 may sense a programming state (for example programmed or erased) of the memory cells 4. The sense amplifier 2 may provide, e.g., generate, a data signal 14, for example a voltage, representative of the programming state of a sensed memory cell 4. The processor 7 may include programming 13, such as software or firmware, for controlling the sense amplifier 2 to sense particular memory cells 4 and for processing the data signals 14 provided by the sense amplifier 2. The processor 7 may generate binary data 15 representative of the programmed state of the memory cell or cells 4 sensed.

Figure 2:
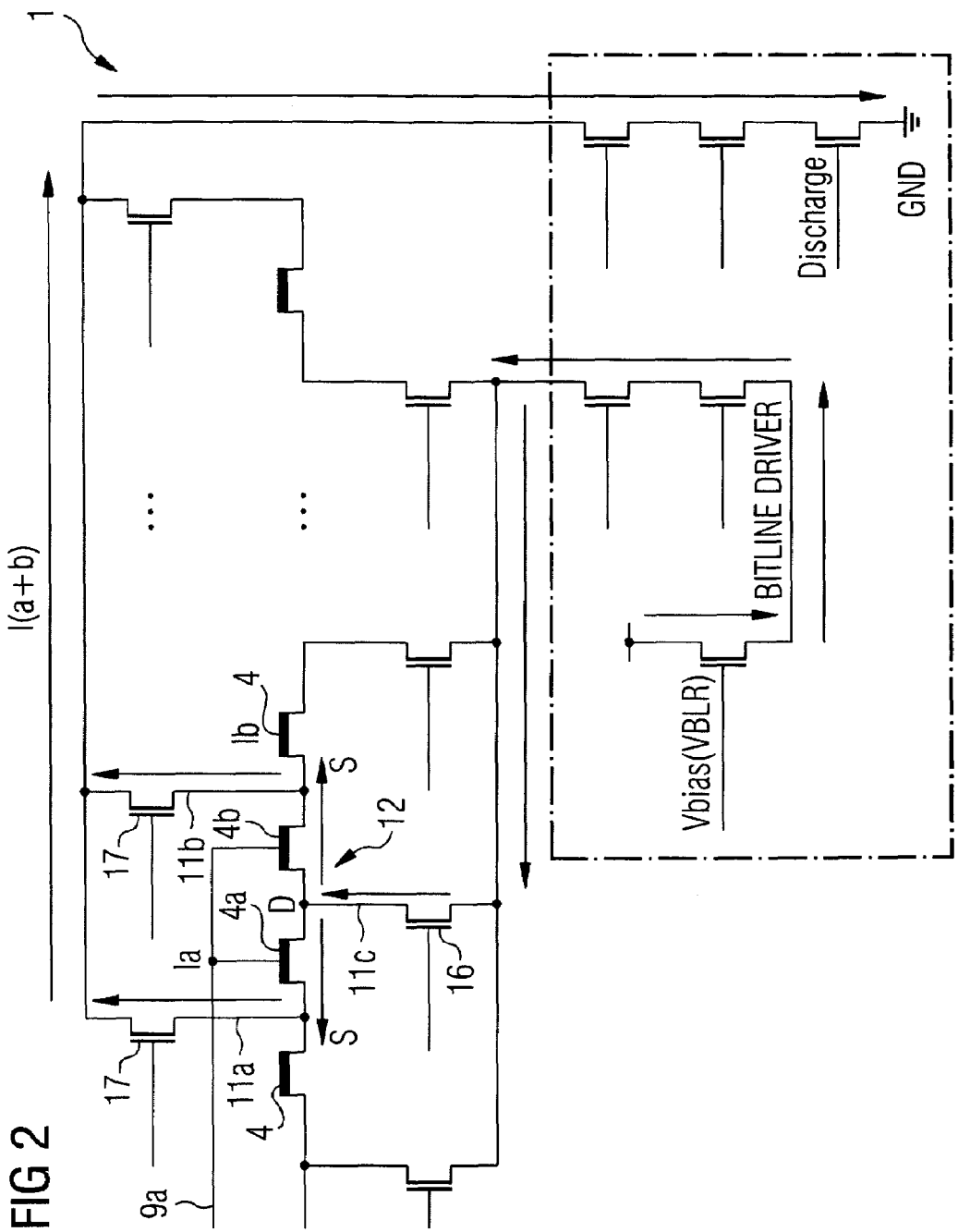
FIG. 2 illustrates a simplified diagram of a detail of an equivalent memory circuit during sensing of memory cells.

FIG. 2 illustrates a simplified diagram of a detail of the equivalent memory circuit 1 during sensing of a plurality 12 (e.g., as shown in FIG. 2) of memory cells 4. In an exemplary embodiment, more than one cell, for example 4a and 4b, may be sensed simultaneously. The sense amplifier 2 may provide a sensing voltage (VBLR), and a select (bottom) transistor 16 may connect the sensing voltage to a common drain D (in the case of drain-side sensing, or a common source in the case of source-side sensing) via a bitline 11c. In an exemplary embodiment, the sensing voltage (VBLR) may be provided after the decoding of the address of the memory cell to be sensed is complete. In an exemplary embodiment, the sensing voltage (VBLR) may be provided such that it is stable during bitline precharge and sensing phase.

A wordline 9a may be coupled to the gate of each memory cell 4a and 4b to be sensed. The memory cells' source sides S (in the case of drain-side sensing, drain side D in the case of source-side sensing) may be coupled to the sense amplifier 2 for sensing via bitlines 11a and 11b via select (top) transistors 17.

In an exemplary embodiment, currents Ia and Ib may be created, the current magnitudes corresponding to a programmed or erased state of the memory cells 4a and 4b. The currents Ia and Ib may combine to be sensed as one current I(a+b). In an exemplary embodiment, the magnitude of the current I(a+b) may correspond to the programmed state of the plurality 12 of memory cells 4, e.g. to the programmed state of memory cells 4a and 4b.

In an exemplary embodiment, the number of programmed or erased states available in a plurality 12 of memory cells 4 may depend, at least in part, on the maximum current window available for each individual cell 4. The window may be the desired difference between the target current range of one memory state (programmed or erased) and of a neighboring memory state.

Figure 3:
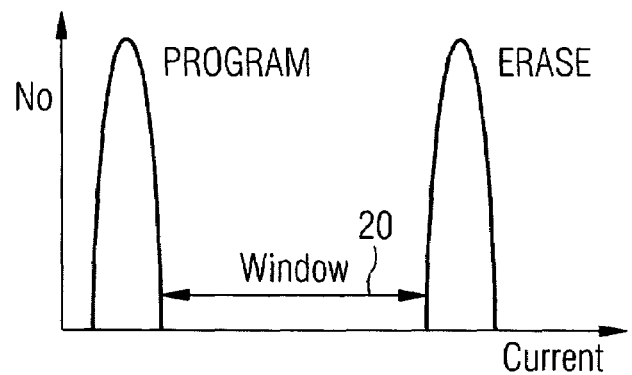
FIG. 3 illustrates the programmed/erased states of a single memory cell.

FIG. 3, for example, illustrates the window 20 between a programmed/erased state of a single memory cell where the single, two-state memory cell is sensed by itself. The window 20 may be defined as the minimum distance between the two distributions PROGRAM and ERASE, in other words the distance between the maximum program current and the minimum erase current. The programmed state of a memory cell may depend on how the cell was programmed during programming. The difference between the programmed current range and the erased state current range may be about 20 μA. In an exemplary embodiment, therefore, the window may be about 20 μA.

In an exemplary embodiment, the size of the window 20 may be fixed by the process to avoid over-programmed cells or over-erased cells. The window 20 may depend, for example, on the total current that may be stored in the particular physical design of the memory cells and the differentiation possible between two states based on the sensing circuitry, sensing voltages and other process parameters and physical limitations. In an exemplary embodiment, the maximum one-cell window and/or the sizes of windows for a system may be determined by the maximum number of erase/program cycles, and/or by the system performance with respect to, e.g., erase time, program time, current consumption during algorithms, voltages in the system, and/or by the array effect.

In an exemplary embodiment, each memory cell sensed individually may store one data bit. Sensing each memory cell individually, however, may be subject to a so-called "neighbor effect," in which current may be leaked from a memory cell to a neighboring memory cell during the sensing process, due at least in part to the voltage difference across the neighbor cell. The loss of current may result in inaccurate reading of data stored in the memory. Sensing more than one memory cell at a time, however, may provide a larger maximum current window, which may permit the storing and sensing of more than one data bit simultaneously.

Figure 4:
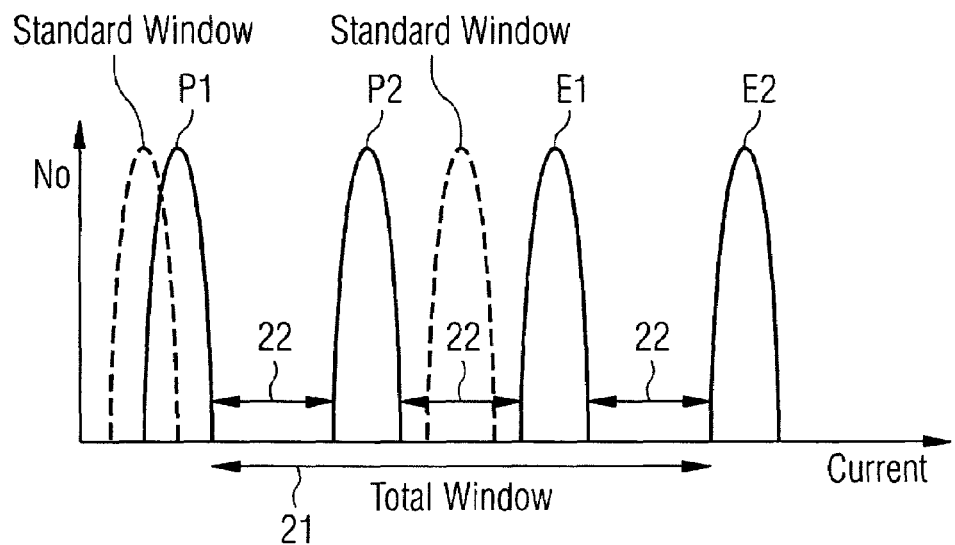
FIGS. 4 and 5 illustrate the programmed/erased states of a plurality of memory cells sensed simultaneously.

FIG. 4 illustrates an exemplary embodiment of erased states (E1, E2) and programmed states (P1, P2) available when sensing a plurality (for example two) memory cells 4a, 4b (FIG. 2) simultaneously. In an exemplary embodiment, the maximum window 21 available from a plurality of cells sensed simultaneously may be increased 2×n times over the window 20 (FIG. 3) for sensing one cell, where n is the number of cells being read simultaneously. This may be because the total charge or current stored in a plurality of cells may be about equal to the charge or current stored in one cell times the total number of cells. The ability of the particular process or system to distinguish between two states, however, may still be the same. As a result, a memory circuit sensing more than one memory cell at a time may take advantage of the increased maximum charge or current to be stored in the plurality of cells and be able to sense more than one data bit from the combined cells. The maximum window may nearly double, for example, when sensing two memory cells simultaneously.

In an exemplary embodiment, the process may permit setting the current window 22 between states at about 13 µA. In an exemplary embodiment, the maximum window 21 may permit up to 2×n, for example four, different programming states (P1, P2, E1 and E2). In an exemplary embodiment, we may refer to these states as P1, P2, E1 and E2 where P1 is a first programmed stated, P2 a second programmed state, E1 a first erased state and E2 a second erased state. For comparison, FIG. 4 illustrates the erased/programmed states and window for a single memory cell with dashed lines (cf. FIG. 3).

Figure 5:
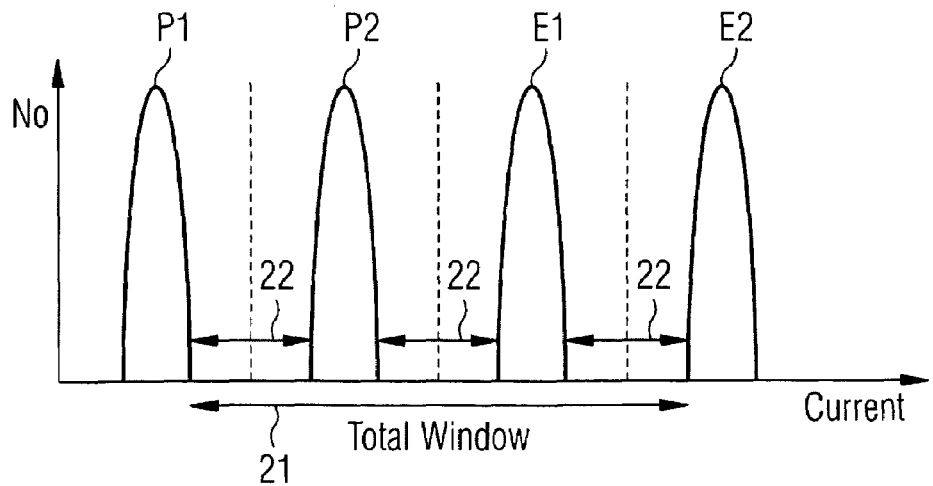

FIG. 5 illustrates an exemplary embodiment of the programmed/erased states for two memory cells being sensed simultaneously. The two cells read simultaneously may have four programmed/erased states, in other words two information bits. In an exemplary embodiment, the number of total states may be the same as the number of information bits as would be possible sensing each memory cell separately. In an exemplary embodiment, this may increase memory space efficiency over other embodiments in which memory cells are sensed two at a time, but where each pair of memory cells is programmed with only one information bit.

Referring again to FIG. 1, in an exemplary embodiment, the sense amplifier 2 senses the current Ia and Ib (FIG. 2) and provides, e.g., generates, a data signal 14 corresponding to the programmed state (P1, P2, E1, E2) (FIG. 5) of the sensed memory cells 4a, 4b (FIG. 2). The data signal 14 may be, for example, an output voltage (Vout). The magnitude of the voltage corresponding to the programmed/erased state sensed from the plurality 12 (FIG. 2) of memory cells just sensed. The processor 7 may include programming 13, such as software or firmware, for processing the data signals 14 provided by the sense amplifier 2. In an exemplary embodiment, the processor 7 may provide binary data 15 corresponding to the programmed/erased state of the memory cells sensed. For example, the processor 7 may provide two information bits for one sensing operation where the sensing operation involves sensing two memory cells simultaneously. The processor 7 may provide as many information bits as memory cells sensed for any given operation. In an exemplary embodiment, for example, the binary data 11, 10, 01, 00 may correspond to the programmed states P1, P2, E1, E2, respectively.

In an exemplary embodiment, sensing a plurality (for example two) of memory cells at a time may provide some compensation for current losses due to the so-called "neighbor effect." The "neighbor effect" may occur in other embodiments when a single memory cell is sensed. Current may leak through a neighboring cell when the bitline is charged for sensing.

In some embodiments, the "neighbor effect" may be compensated for, at least in part, by sensing two memory cells simultaneously but while storing only one information bit in the simultaneously sensed pair of memory cells. Storing only one information bit using two memory cells, however, may result in lower efficiency in using the memory array. Storing and sensing more than one information bit in a plurality of memory cells to be sensed simultaneously may compensate, at least in part, for the so-called "neighbor effect," while providing increased efficiency in using the physical space of an array to store information.

In other embodiments, the "neighbor effect" may be compensated for by using a residual discharge/charge. In other words, the neighbor cells may be biased to the same level of the cell being sensed at least for the side used to sense the cell current. The use of a residual discharge/charge may incur costs of increased power consumption (because all of the global bitlines must be discharged/charged and discharging/charging the global bitline previously used) and access time (for example, because the operation may be performed before each read operation and must be well done).

Exemplary embodiments allow for canceling at least partially disturbance(s) coming from one or more neighbor cells. While in conventional memory cell arrays, expensive sequences (with respect to time and/or current) have to be performed before starting the read phase, this is not required anymore using exemplary embodiments of the invention.

While the foregoing is directed to exemplary embodiments of the present disclosure, other and further embodiments of the disclosure may be devised without departing from the basic scope thereof.

What is claimed is:

1. A method of reading memory, the method comprising:
simultaneously sensing data signals provided by a plurality of memory cells;
providing a data signal from each of said plurality of memory cells corresponding to one of at least two programming states;
combining said provided data signal from each of said memory cells wherein the combined plurality of data signals representing programming states comprise a number of programming states greater than a number of memory cells in the plurality of memory cells; and
processing the data signal and providing binary data representative of the data signal, wherein the binary data includes a number of information bits equal to the number of memory cells.

2. The method of claim 1, wherein the number of memory cells in the plurality of memory cells equals two.

3. The method of claim 2, wherein the plurality of programming states comprise a number of programming states equal to twice a number of memory cells in the plurality of memory cells.

4. The method of claim 1, wherein the plurality of programming states comprise a number of programming states equal to twice a number of memory cells in the plurality of memory cells.

5. The method of claim 1, wherein the plurality of programming states comprise a number of programming states equal to two to the power of a number of memory cells in the plurality of memory cells.

6. The method of claim 1, wherein sensing the plurality of memory cells simultaneously comprising providing a sensing voltage to a common drain of a pair of memory cells and comprises sensing a total current, wherein the total current has a magnitude that corresponds to the one of the plurality of programming states.

7. The method of claim 6, wherein sensing the plurality of memory cells comprises coupling corresponding bitlines from corresponding sources of each of the pair of memory cells to a sense amplifier.

8. The method of claim 1, wherein sensing the plurality of memory cells simultaneously comprises sensing a plurality of non-volatile memory cells simultaneously.

9. A memory circuit comprising:

a sense amplifier arranged to selectively couple a sense voltage to a common bitline shared by a pair of memory cells and to selectively couple separate sensing bitlines to each memory cell of the pair of memory cells, to sense a combined current simultaneously provided from the pair of memory cells responsive to the sense voltage, the total current being indicative of one of at least four programming states, and to provide a data signal representative of the one of the at least four programming states; and a processor for processing the data signal and providing binary data corresponding to at least two data bits representative of the one of the at least four programming states.

10. The memory circuit of claim 9, wherein the common bitline is coupled to a drain shared by each of the pair of memory cells and the separate sensing bitlines are coupled to respective sources of each of the pair of memory cells.

11. The memory circuit of claim 9, wherein the pair of memory cells comprise non-volatile memory cells.

12. The memory circuit of claim 9, wherein the pair of memory cells are arranged in an array of rows and columns, each sensing bitline extending at least partially along a column.

13. The memory circuit of claim 12, further comprising a plurality of wordlines, each wordline coupled to memory cells along a row of the array.

14. The memory circuit of claim 12, further comprising a row decoder coupled to the array and a column decoder coupled to the array.

15. A memory circuit, comprising:

an array of non-volatile memory cells arranged in rows and columns;

a row decoder coupled to the array;

a column decoder coupled to the array;

a sense amplifier coupled to the array, the sense amplifier arranged to selectively couple a sense voltage to a common bitline shared by a pair of memory cells and to selectively couple separate sensing bitlines to each memory cell of the pair of memory cells, to sense a combined current simultaneously provided from the pair of memory cells responsive to the sense voltage, the total current being indicative of one of at least four programming states, and to provide a data signal representative of the one of the at least four programming states; and a processor for processing the data signal and providing binary data corresponding to at least two data bits representative of the one of the at least four programming states.

16. The memory circuit of claim 15, wherein the common bitline is coupled to a drain shared by each of the pair of memory cells and the separate sensing bitlines are coupled to respective sources of each of the pair of memory cells.

* * * * *